(12) United States Patent
Aruga et al.

(10) Patent No.: US 8,674,712 B2
(45) Date of Patent: Mar. 18, 2014

(54) APPARATUS FOR DRIVING PLACING TABLE

(75) Inventors: Tsuyoshi Aruga, Nirasaki (JP); Hiroshi Shimoyama, Nirasaki (JP); Hiroshi Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 393 days.

(21) Appl. No.: 13/159,108

(22) Filed: Jun. 13, 2011

(65) Prior Publication Data

US 2011/0304348 A1      Dec. 15, 2011

(30) Foreign Application Priority Data

Jun. 15, 2010  (JP) ................................. 2010-136070

(51) Int. Cl.
  *G01R 31/00*      (2006.01)
  *G01R 31/28*      (2006.01)
(52) U.S. Cl.
  CPC ........ *G01R 31/2891* (2013.01); *G01R 31/2887* (2013.01)
  USPC ................................................... 324/750.01
(58) Field of Classification Search
  None
  See application file for complete search history.

(56) References Cited

U.S. PATENT DOCUMENTS

| | | | | |
|---|---|---|---|---|
| 5,510,724 A * | 4/1996 | Itoyama et al. | ........... | 324/750.05 |
| 5,614,834 A * | 3/1997 | Black et al. | ............... | 324/754.23 |
| 6,468,816 B2 * | 10/2002 | Hunter | ............................. | 438/14 |
| 6,756,751 B2 * | 6/2004 | Hunter | ........................... | 318/135 |
| 6,906,546 B2 * | 6/2005 | Tanioka et al. | ............. | 324/750.1 |
| 6,958,618 B2 * | 10/2005 | Amemiya et al. | ........ | 324/756.03 |
| 7,119,566 B2 * | 10/2006 | Kim | ........................... | 324/750.19 |
| 2007/0262783 A1 | 11/2007 | Hosaka et al. | | |

FOREIGN PATENT DOCUMENTS

| | | | |
|---|---|---|---|
| CN | 1662821 A | | 8/2005 |
| KR | 1020100003706 A | | 1/2010 |

* cited by examiner

*Primary Examiner* — Paresh Patel
(74) *Attorney, Agent, or Firm* — Abelman, Frayne & Schwab

(57) ABSTRACT

Disclosed is an apparatus for driving a placing table that contributes to saving a space and reducing the weight of an inspecting apparatus. The apparatus for driving a placing table according to an exemplary embodiment of the present disclosure includes a horizontal driving mechanism that horizontally moves a placing table in an inspecting chamber, a base that supports horizontal driving mechanism, a placing table lifting mechanism (for example, air bearing) that lifts placing table from support, using compressed air in inspecting chamber, a connecting mechanism that connects horizontal driving mechanism with placing table, and a case that accommodates the horizontal driving mechanism and the base.

12 Claims, 4 Drawing Sheets

APPARATUS FOR DRIVING PLACING TABLE

CROSS-REFERENCE TO RELATED APPLICATIONS

This application is based on and claims priority from Japanese Patent Application No. 2010-136070, filed on Jun. 15, 2010, with the Japanese Patent Office, the disclosure of which is incorporated herein in its entirety by reference.

TECHNICAL FIELD

The present disclosure relates to an apparatus for driving a placing table that drives the placing table used to inspect electrical properties of an object to be inspected, such as a semiconductor wafer, disposed on the placing table, in an inspecting apparatus. More particularly, the present disclosure relates to an apparatus for driving a placing table that can contribute to saving a space and reducing the weight for an inspecting apparatus.

BACKGROUND

An inspecting apparatus of the related art has, for example, a loader chamber 1 and an inspecting chamber 2 that are adjacent to each other, as shown in FIG. 4. Loader chamber 1 has a cassette accommodating unit that accommodates a plurality of semiconductor wafers W in a cassette unit, a wafer transfer mechanism that carries in and out semiconductor wafers W one by one from the cassette, and a pre-alignment mechanism that performs a preliminary alignment of semiconductor wafers W with respect to positions thereof while semiconductor wafers W are transferred by the wafer transfer mechanism.

Inspecting chamber 2 has a placing table 3 that holds semiconductor wafer W and can move in X, Y, Z, and θ directions, a probe card 4 that is in electric contact with semiconductor wafers W on placing table 3, a clamp mechanism 5 that fixes probe card 4 using a card holder (not shown), and a coupling ring 6 that electrically contacts probe card 4 and a test head T. Further, the electrical properties of semiconductor wafers W are inspected at inspecting chamber 2 by transmitting and receiving a test signal between semiconductor wafer W and a tester (not shown) through test head T, coupling ring 6, and probe card 4 under the control of a control unit. Further, in FIG. 4, reference numeral '7' represents an alignment mechanism that together with placing table 3 performs an alignment of semiconductor wafers W with probe card 4 with respect to their positions, reference numeral '7A' represents an upper camera disposed on an alignment bridge, reference numeral '7B' represents a lower camera on placing table 3, and reference numeral '8' represents a head plate where clamp mechanism 5 is fixed.

When the electrical properties of semiconductor wafer W are inspected, a plurality of electrode pads of semiconductor wafer W and a probe 4A of probe card 4 corresponding to the electrode pads are aligned prior to the inspection, semiconductor wafer W and probe card 4 are brought into electrical contact with each other, and then the electrical properties of the device are inspected. In this process, placing table 3 is moved in the X direction and Y direction by an XY-table 9, such that semiconductor wafer W is moved to an inspection position.

Further, if necessary, it may be possible to inspect the electrical properties of a plurality of devices of a semiconductor wafer W by making all electrode pads formed on semiconductor wafer W in contact with all probes 4A of probe card 4.

However, in the inspecting apparatus of the related art, placing table 3 is widely moved in a horizontal direction by XY-table 9 in inspecting chamber 2, such that the movement area of placing table 3 becomes wider. Further, XY-table 9 is needed to be finished with high accuracy and high rigidity in order to drive and control the operation of placing table 3 in a micron-order precision, such that the weight of XY-table 9 increases. Furthermore, the diameter of semiconductor wafer W also increases, such that the weight of XY-table 9 remarkably increases.

SUMMARY

An exemplary embodiment of the present disclosure provides an apparatus for driving a placing table that moves a placing table from the outside of an inspecting chamber which includes the placing table where an object to be inspected is disposed, a probe card disposed above the placing table, and a support supporting the placing table, the apparatus including: a horizontal driving mechanism that horizontally moves the placing table; a placing table lifting mechanism that lifts the placing table from the support; and a connecting mechanism that connects the horizontal driving mechanism with the placing table. The horizontal driving mechanism and the placing table are connected with each other, such that the placing table lifted from the support is horizontally moved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 2 is a view illustrating the relationship between an inspecting chamber and the apparatus for driving a placing table shown in FIG. 1, in which FIG. 2(a) is a side view showing a state where the apparatus for driving a placing table and a placing table in the inspecting chamber are connected, and FIG. 2(b) is a plan view showing the placing table and a support in the inspecting chamber and a support.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to solve the problems described above, and intends to provide an apparatus for driving a placing table that contributes to saving a space and reducing the weight for an inspecting apparatus.

In order to achieve the object described above, an exemplary embodiment of the present disclosure provides an apparatus for driving a placing table configured to move a placing table from the outside of an inspecting chamber which includes the placing table where an object to be inspected is disposed, a probe card disposed above the placing table, and a support that supports the placing table, the apparatus including: a horizontal driving mechanism configured to horizontally move the placing table; a placing table lifting mechanism configured to lift the placing table from the support; and a connecting mechanism configured to connect the horizontal driving mechanism with the placing table. The horizontal driving mechanism and the placing table are connected with each other, such that the placing table lifted from the support is horizontally moved.

Further, the horizontal driving mechanism may include an X-table moving in an X direction and a Y-table moving in a Y direction.

Also, in the apparatus for driving a placing table described above, the placing table lifting mechanism may be an air bearing.

The apparatus for driving a placing table may further include a vacuum adsorbing apparatus configured to fix the placing table on the support.

In the apparatus for driving a placing table described above, the connecting mechanism may include a coupling body horizontally extending from the horizontal driving mechanism and an electromagnet disposed at the placing table and configured to adsorb the coupling body.

The apparatus for driving a placing table may further include a transfer mechanism configured to transfer the object to be inspected onto the placing table.

In the apparatus for driving a placing table described above, the plurality of inspecting chambers may be arranged in a line.

According to the exemplary embodiments of the present disclosure, it is possible to provide an apparatus for driving a placing table contributing to saving a space and reducing the weight for an inspecting apparatus.

Figure 1:
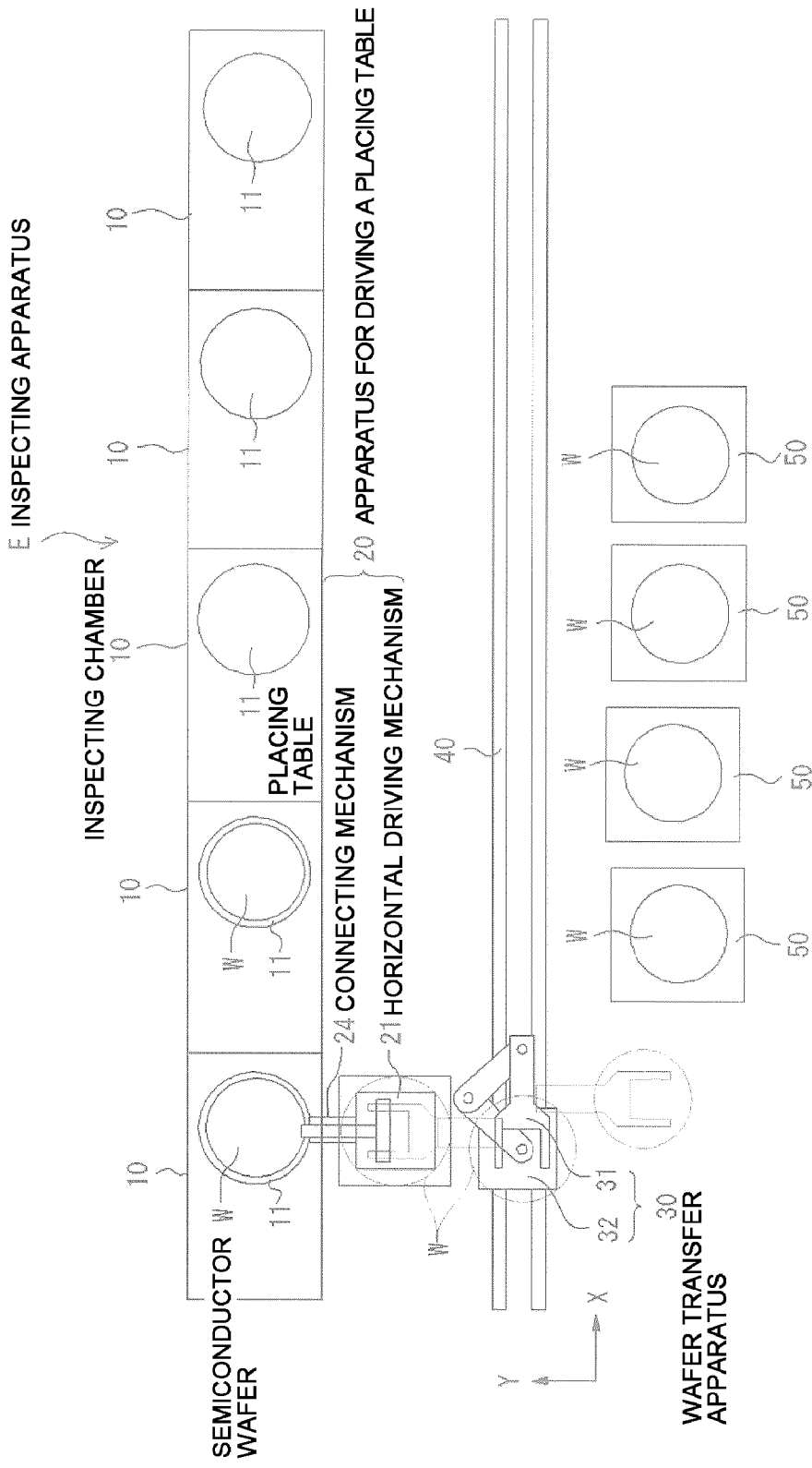
FIG. 1 is a plan view illustrating an inspecting apparatus where an exemplary embodiment of an apparatus for driving a placing table of the present disclosure is embodied.

An apparatus for driving a placing table according to an exemplary embodiment of the present disclosure is applied to an inspecting apparatus equipped with a plurality of inspecting chambers, for example, as shown in FIG. 1. Therefore, the apparatus for driving a placing table according to the exemplary embodiment of the present disclosure is described with the inspecting apparatus shown in FIGS. 1 to 3.

An inspecting apparatus E according to the exemplary embodiment of the present disclosure, as shown in FIG. 1, includes a plurality of inspecting chambers 10 (e.g., five chambers) sequentially provided and arranged in the X direction, one apparatus for driving a placing table 20 that moves along inspecting chambers 10, and a wafer transfer apparatus 30 that transfers semiconductor wafers W one by one. Inspecting chambers 10, apparatus for driving a placing table 20, and wafer transfer apparatus 30 are connected with one another by a communication line to be driven under the control of an integrated control apparatus (not shown).

Figure 2:
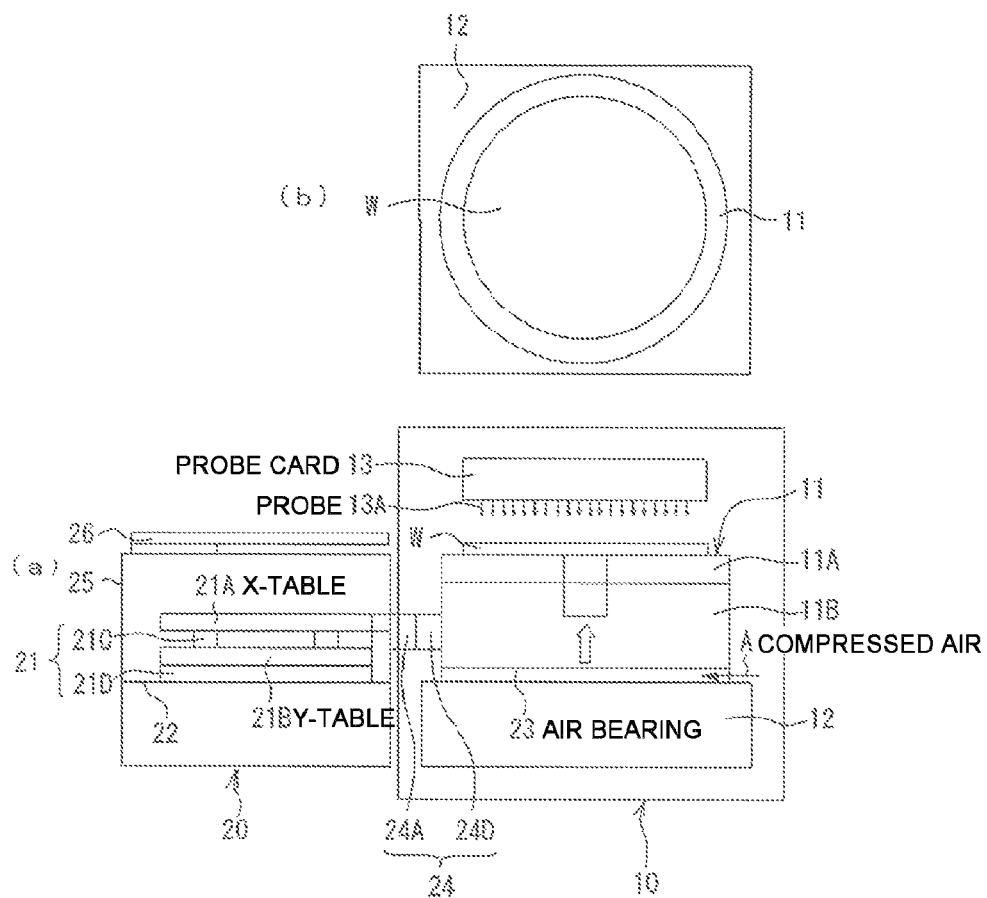

Inspecting chamber 10, as shown in FIGS. 1 and 2, includes a placing table 11 where semiconductor wafers W are placed, a support 12 that supports placing table 11, a probe card 13 that is disposed above placing table 11, an alignment mechanism (not shown) that performs an alignment of a plurality of probes 13A of probe card 13 with a plurality of electrode pads of semiconductor wafers W on placing table 11 with respect to their positions, and a control device (not shown) that controls the constitutional elements 11, 12 and 13. Inspecting chamber 10 is configured in such a way that probe cards 13 are in contact with semiconductor wafers W on placing table 11, inspecting the electrical properties of all the devices of semiconductor wafers W by one contact.

Placing table 11, as shown in FIG. 2, includes a chucktop 11A that adsorbs and fixes semiconductor wafers W, an elevation driving mechanism 11B that moves chucktop 11A in up and down directions, and a θ-direction driving mechanism (not shown) that moves chucktop 11A in the θ direction, and placing table 11 is fixed at the center of support 12 by a vacuum apparatus when semiconductor wafers W are inspected. Placing table 11, for example, is disposed on support 12, with respect to the aligned point of the axial center and the center of support 12 as a reference position. Further, probe card 13 has number of probes such that the probes may correspondingly contact the electrode pads of all the devices formed on the entire surface of semiconductor wafer W.

Therefore, while placing table 11 moves, positions of the electrode pads of semiconductor wafer W on placing table 11 are aligned with those of probes 13A of probe card 13 by the alignment mechanism, and then probe card 13 and the electrode pads of all the devices of semiconductor wafer W are brought in contact, inspecting the electrical properties of all the devices of semiconductor wafer W.

Apparatus for driving a placing table 20 according to the exemplary embodiment of the present disclosure is constructed to move along five inspecting chambers 10 at the outside of inspecting chambers 10, and move and operate placing table 11 onto support 12 from the outside of inspecting chambers 10 during an alignment process of semiconductor wafer W with probe card 13 or an inspection process of semiconductor wafer W. Apparatus for driving a placing table 20, as shown in FIGS. 1 and 2, includes a horizontal driving mechanism 21 that horizontally moves placing table 11 in inspecting chambers 10, a base 22 that supports horizontal driving mechanism 21, a placing table lifting mechanism 23 (for example, air bearing) that lifts placing table 11 from support 12, using, for example, compressed air, a connecting mechanism 24 that connects horizontal driving mechanism 21 with placing table 11, and a case 25 that accommodates horizontal driving mechanism 21. In addition, apparatus for driving a placing table 20 is controlled to move in the X direction along five inspecting chambers 10 and stop at the front center of each inspecting chamber 10 by a driving mechanism through communicating with inspecting chambers 10. Further, an arm mechanism 26 that transports semiconductor wafers W is disposed on the top surface of case 25 to transport semiconductor wafers W between inspecting chambers 10.

Figure 4:
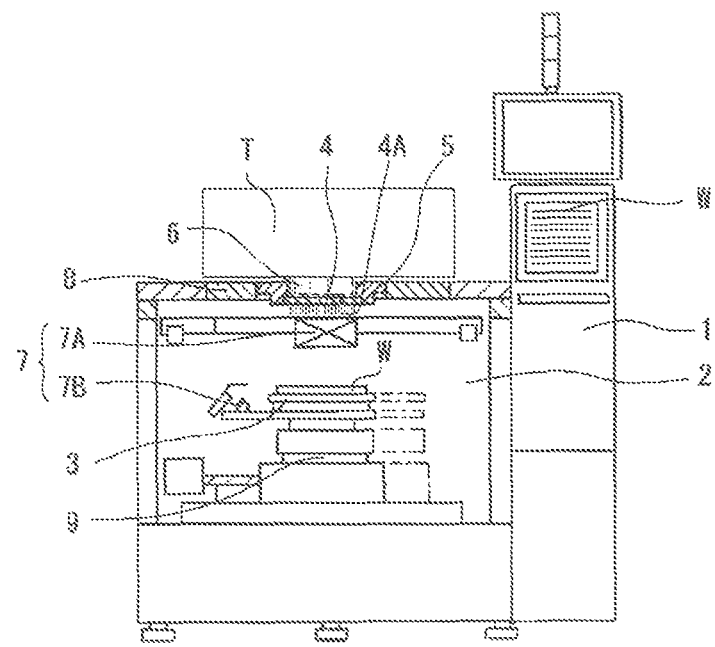
FIG. 4 is a view illustrating an example of an inspecting apparatus of the related art, that is, a front view showing the inspecting apparatus having a portion cut away.

Horizontal driving mechanism 21, as shown in FIG. 2, includes an X-table 21A that moves in the X direction and a Y-table 21B that moves in the Y direction, in which X-table 21A moves along an X-directional rail 21C disposed on Y-table 21B by a motor (not shown), and Y-table 21B moves along a Y-directional rail 21D disposed on base 22 by a motor (not shown). Horizontal driving mechanism 21 is configured in accordance with that of the inspecting apparatus of the related art shown in FIG. 4.

Air bearing 23, as shown in FIG. 2, is disposed under placing table 11, and is operated by compressed air A supplied from an air supplier (not shown) to lift placing table 11 by a predetermined distance in the direction indicated by the white arrow (Z direction) from support 12. Therefore, placing table 11 is lifted from the top of support 12 by the operation of air bearing 23 and horizontally moves within the top of support 12 by horizontal driving mechanism 21. Air bearing 23 may be one of those air bearings known in the art.

Figure 3:
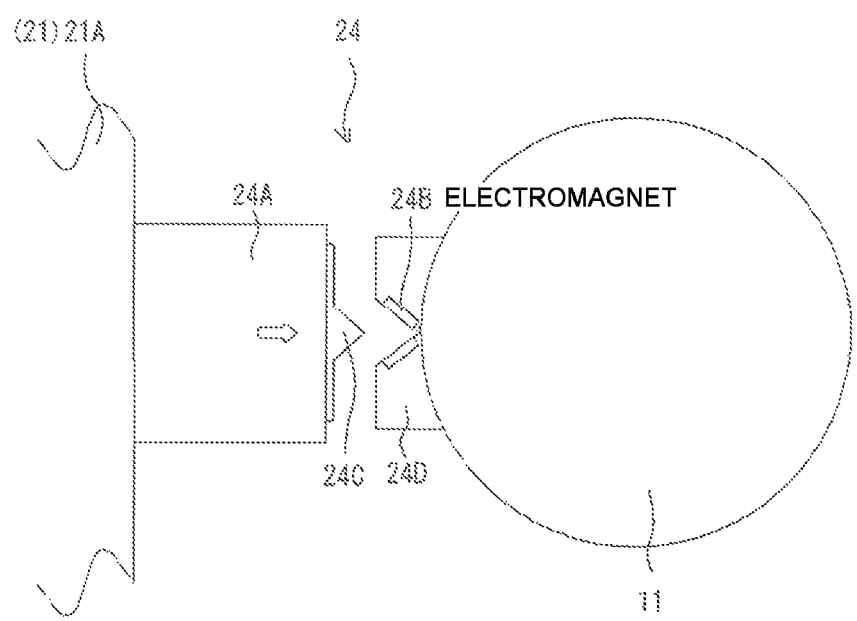
FIG. 3 is a plan view illustrating a connecting mechanism for the apparatus for driving a placing table and the placing table shown in FIG. 2.

Horizontal driving mechanism 21 and placing table 11 are connected and disconnected by connecting mechanism 24, as shown in FIGS. 1 to 3. Connecting mechanism 24, as shown in FIG. 3, includes, for example, a coupling body 24A that can move forward/backward, horizontally extending from the width center of X-table 21A to inspecting chamber 10, and an electromagnet 24B that is disposed on the circumferential surface of placing table 11 and adsorbs coupling body 24A which can move forward/backward with respect to X-table 21A. A triangular protrusion 24C is formed at the front end of coupling body 24A, and electromagnet 24B disposed on the edge of placing table 11 adsorbs protrusion 24C to connect horizontal driving mechanism 21 and placing table 11. Further, when horizontal driving mechanism 21 and placing table 11 are connected, coupling body 24A can move up with following the upward movement of placing table 11 in horizontal driving mechanism 21. Further, an opening through which coupling body 24A is moved in/out is formed at inspecting chamber 10.

Further, wafer transfer apparatus 30, as shown in FIG. 1, is disposed at a position where apparatus for driving a placing table 20 is placed between inspecting chambers 10. Wafer transfer apparatus 30 has a multi-joint arm 31 and a case 32 accommodating a driving mechanism for multi-joint arm 31, and configured to be moved in the X direction along a rail 40 disposed in parallel with five inspecting chambers 10. Further, a plurality of wafer storages 50 that temporarily store semiconductor wafers W are disposed in the X direction, at positions opposite to apparatus for driving a placing table 20, with rail 40 being interposed therebetween. Therefore, wafer transfer apparatus 30 moves in the X direction along rail 40 and transports semiconductor wafers W between wafer storages 50 and an arm mechanism 26 of apparatus for driving a placing table 20 by multi-joint arm 31.

Continuously, the operation of apparatus for driving a placing table 20 is described when inspecting semiconductor wafers W. First, as inspecting apparatus E is operated under the control of the integrated control apparatus, as shown in FIG. 1, wafer transfer apparatus 30 moves along rail 40 and stops at the front of a predetermined wafer storage 50, and multi-joint arm 31 operates to take out a sheet of semiconductor wafer W from wafer storage 50. Thereafter, as shown in FIG. 1, wafer transfer apparatus 30 moves along rail 40 up to the position opposite to a predetermined inspecting chamber 10 (at the leftmost side in FIG. 1). During this operation, apparatus for driving a placing table 20 moves and stops at the front of the leftmost inspecting chamber 10. At this time, electromagnet 24B at a side of placing table 11 is positioned on the extension line of coupling body 24A of connecting mechanism 24, and placing table 11 is fixed by vacuum adsorption at the center of support 12.

When apparatus for driving a placing table 20 stops at the front of inspecting chamber 10, coupling body 24A of connecting mechanism 24 moves into inspecting chamber 10 from horizontal driving mechanism 21, and protrusion 24C is adsorbed to electromagnet 24B at a side of placing table 11, such that horizontal driving mechanism 21 and placing table 11 are connected. Continuously, multi-joint arm 31 of wafer transfer apparatus 30 and arm mechanism 26 of apparatus for driving a placing table 20 are driven, such that semiconductor wafer W is transported between multi-joint arm 31 and arm mechanism 26. After arm mechanism 26 receives semiconductor wafer W from multi-joint arm 31, arm mechanism 26 moves into inspecting chamber 10 and delivers semiconductor wafer W to chucktop 11A of placing table 11, and then moves out of inspecting chamber 10. At this time, coupling body 24A of connecting mechanism 24 and electromagnet 24B at a side of placing table 11 are disconnected, and coupling body 24A is moved out of inspecting chamber 10.

When apparatus for driving a placing table 20 finishes the delivery operation of semiconductor wafer W to the leftmost inspecting chamber 10, the apparatus moves to another inspecting chamber 10 that requires a wafer and delivers semiconductor wafer W into inspecting chamber 10 by repeating the same operations. As described above, apparatus for driving a placing table 20 efficiently transports semiconductor wafer W between wafer storage 50 and five inspecting chambers 10 while moving back and forth among inspecting chambers 10.

The electrical properties of semiconductor wafer W are inspected at the leftmost inspecting chamber 10 that has received semiconductor wafer W. That is, in inspecting chamber 10, after chucktop 11A of placing table 11 is rotated at a predetermined angle to adjust semiconductor wafer W in a predetermined direction by θ-direction driving mechanism, placing table 11 fixed on support 12 is released and lifted from support 12 through air bearing 23, such that placing table 11 can freely move from the reference position on support 12. In this state, placing table 11 is moved in the X direction and the Y direction by horizontal driving mechanism 21, and performs an alignment of electrode pads of semiconductor wafer W on placing table 11 with probes 13A of probe card 13 for an inspection, in cooperation with the alignment mechanism. After performing an alignment operation of semiconductor wafer W with probe card 13, placing table 11 is fixed on support 12 at the alignment position. Continuously, chucktop 11A of placing table 11 is moved up by the elevation driving mechanism, all of the electrode pads of semiconductor wafer W and all of probes 13A of probe card 13 are brought into contact with one another. Chucktop 11A is then overdriven causing all of the electrode pads are brought into electrical contact with all of probes 13A, respectively. As a result, the electrical properties of all of the devices of semiconductor wafer W are sequentially inspected.

When the inspection of semiconductor wafer W is completed, apparatus for driving a placing table 20 is called by performing a communication between the leftmost inspecting chamber 10 and apparatus for driving a placing table 20, and semiconductor wafer W for which the inspection has been completed is received from inspecting chamber 10 by apparatus for driving a placing table 20. That is, arm mechanism 26 of apparatus for driving a placing table 20 moves into inspecting chamber 10 and receives semiconductor wafer W for which the inspection has been completed from placing table 11. Arm mechanism 26 then sequentially transfers the semiconductor wafer W outside inspecting chamber 10, and to multi-joint arm 31 of wafer transfer apparatus 30. As multi-joint arm 31 receives the semiconductor wafer W for which the inspection has been completed, wafer transfer apparatus 30 moves along rail 40 and stops at the front of corresponding wafer storage 50, and then returns the semiconductor wafer W to a predetermined wafer storage 50. Thereafter, subsequent semiconductor wafers W that have not been inspected yet are sequentially inspected by the process described above.

According to the exemplary embodiment described above, since apparatus for driving a placing table 20 that horizontally moves placing table 11 in inspecting chamber 10 is disposed outside inspecting chamber 10, the horizontal driving mechanism in inspecting chamber 10 can be omitted, such that it is possible to reduce the weight of the driving device in inspecting chamber 10, save the space inside inspecting chamber 10, and facilitate the cost reduction.

Further, even if five inspecting chambers 10 are provided in the exemplary embodiment described above, the cost of inspecting apparatus E can be considerably reduced since it is possible to share apparatus for driving a placing table 20 in five inspecting chambers 10.

Further, the present disclosure is not limited to the exemplary embodiment described above. For example, although the electromagnet is used as the connecting mechanism in the exemplary embodiment described above, a clamp mechanism that mechanically holds the front end of the coupling body may be used as the connecting mechanism. Further, although the apparatus for driving a placing table is equipped with the arm mechanism, it is possible to omit the arm mechanism of the apparatus for driving a placing table and directly transport the semiconductor wafer between the multi-joint arm of the wafer transfer apparatus and the placing table. Further, it is possible to omit the wafer transfer apparatus and provide the apparatus for driving a placing table with an arm mechanism, such as a multi-joint arm.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for driving a placing table that moves a placing table from an outside of an inspecting chamber which includes the placing table where an object to be inspected is disposed, a probe card disposed above the placing table, and a support that supports the placing table, the apparatus comprising:
   a horizontal driving mechanism configured to horizontally move the placing table;
   a placing table lifting mechanism configured to lift the placing table from the support; and
   a connecting mechanism configured to connect the horizontal driving mechanism with the placing table,
   wherein the horizontal driving mechanism and the placing table are connected, such that the placing table lifted from the support is horizontally moved.

2. The apparatus of claim 1, wherein the horizontal driving mechanism includes an X-table moving in an X direction and a Y-table moving in a Y direction.

3. The apparatus of claim 1, wherein the placing table lifting mechanism is an air bearing.

4. The apparatus of claim 1, further comprising a vacuum adsorption apparatus configured to fix the placing table on the support.

5. The apparatus of claim 1, wherein the connecting mechanism includes a coupling body horizontally extending from the horizontal driving mechanism and an electromagnet disposed at the placing table and configured to adsorb the coupling body.

6. The apparatus of claim 1, further comprising a transfer apparatus configured to transfer the object to be inspected onto the placing table.

7. The apparatus of claim 1, wherein the plurality of inspecting chambers are arranged in a line.

8. The apparatus of claim 2, wherein the placing table lifting mechanism is an air bearing.

9. The apparatus of claim 2, further comprising a vacuum adsorption apparatus configured to fix the placing table on the support.

10. The apparatus of claim 2, wherein the connecting mechanism includes a coupling body horizontally extending from the horizontal driving mechanism and an electromagnet disposed at the placing table and configured to adsorb the coupling body.

11. The apparatus of claim 2, further comprising a transfer apparatus configured to transfer the object to be inspected onto the placing table.

12. The apparatus of claim 2, wherein the plurality of inspecting chambers are arranged in a line.

* * * * *